United States Patent [19]
Stein

[11] Patent Number: 5,917,837
[45] Date of Patent: Jun. 29, 1999

[54] METHOD AND APPARATUS FOR PERFORMING DECODING OF CODES WITH THE USE OF SIDE INFORMATION ASSOCIATED WITH THE ENCODED DATA

[75] Inventor: Jeremy M. Stein, Tel-Aviv, Israel

[73] Assignee: Qualcomm, Incorporated, San Diego, Calif.

[21] Appl. No.: 08/712,065

[22] Filed: Sep. 11, 1996

[51] Int. Cl.[6] .................................................. H03M 13/00
[52] U.S. Cl. ...................... 371/37.7; 371/37.06; 371/43.7
[58] Field of Search ............................... 371/37.7, 37.02, 371/37.06, 43.7, 37.4

[56] References Cited

U.S. PATENT DOCUMENTS

| | | | |
|---|---|---|---|
| 4,748,626 | 5/1988 | Wong | 371/30 |
| 4,845,714 | 7/1989 | Zook | 371/50 |
| 5,023,889 | 6/1991 | Divsalar et al. | 375/27 |
| 5,056,117 | 10/1991 | Gitlin et al. | 375/102 |
| 5,208,816 | 5/1993 | Seshardi et al. | 371/43 |
| 5,396,516 | 3/1995 | Padovani et al. | 375/225 |
| 5,416,787 | 5/1995 | Kodama et al. | 371/43 |
| 5,577,053 | 11/1996 | Dent | 371/37.4 |
| 5,606,569 | 2/1997 | MacDonald et al. | 371/37.7 |
| 5,673,291 | 9/1997 | Dent | 375/262 |

FOREIGN PATENT DOCUMENTS

| | | | |
|---|---|---|---|
| 0413505 | 8/1990 | European Pat. Off. | H03M 13/12 |
| 0544315 | 11/1992 | European Pat. Off. | H03M 13/00 |
| 0609188 | 8/1994 | European Pat. Off. | H03M 13/00 |
| 0729150 | 8/1996 | European Pat. Off. | G11B 20/12 |
| 9617454 | 6/1996 | WIPO | H04L 1/24 |

OTHER PUBLICATIONS

"Viterbi Decoding Algorithm for Convolutional Codes with Repeat Request" by Hirosuke Yamamoto et al.; *IEEE Transactions on Information Theory*, vol. IT–26 No. 26. pp. 540–547.

"Generalized Viterbi Algorithms for Error Detection with Convolutional Codes" by N. Seshadri et al.; *AT&T Bell Laboratories*, 1989 IEEE pp. 1534–1538.

"Combined Source and Channel Coding of Subband Coded Speech with Post–enhancement" by W.C. Wong et al.;*Communications Systems;Toward Global Integration*, Nov. 1990, vol. 2. 886–890.

*Primary Examiner*—Stephen M. Baker
*Attorney, Agent, or Firm*—Russell B. Miller; Bruce W. Greenhaus; Sean S. English

[57] ABSTRACT

The present invention is a novel and improved method and apparatus for decoding a frame of digital data which contains redundant information provided to validate the decoding operation. In the present invention, a frame of data contains information bits and cyclic redundancy check (CRC) bits. The received frame is decoded and a check is conducted to determine whether the CRC bits correspond correctly for the decoded information bits. If the decoded frame passes the CRC test process, the decoded fame is provided to the user. However, if the decoded frame does not pass the CRC test, then at least one additional decoding process is performed on the received frame. In the first exemplary embodiment of the present invention, if the CRC test is failed, a noise vector of a predetermined set of noise vectors is summed with the received frame and the resultant frame is decoded for a second time. In the second exemplary embodiment of the present invention, when the CRC test fails, a set of the received symbols are replaced with symbol erasure indications.

24 Claims, 6 Drawing Sheets

R - RESERVED BIT
F - FRAME QUALITY INDICATOR (CRC)
T - ENCODER TAIL BITS

FIG. 7

METHOD AND APPARATUS FOR PERFORMING DECODING OF CODES WITH THE USE OF SIDE INFORMATION ASSOCIATED WITH THE ENCODED DATA

BACKGROUND OF THE INVENTION

I. Field of the Invention

The present invention relates to digital signal processing. More particularly, the present invention relates to a novel and improved method and apparatus for decoding a frame of digital data that contains an outer error detecting code, e.g., redundant check bits, or any other side information which is known about the data.

II. Description of the Related Art

As wireless communication technology has advanced, users of those systems have come to demand higher transmission quality is in the services provided. One means of providing higher transmission quality to provide that service using digital transmission techniques. The use of code division multiple access (CDMA) modulation is one of several techniques for providing digital wireless transmission. Other methods of digital wireless transmission include time division multiple access (TDMA) and frequency division multiple access (FDMA).

However, the spread spectrum modulation technique of CDMA has significant advantages over other digital modulation techniques. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS", assigned to the assignee of the present invention and incorporated by reference herein. The use of CDMA techniques in a multiple access communication system is further disclosed in U.S. Pat. No. 5,103,459, entitled "SYSTEM AND METHOD FOR GENERATING SIGNAL WAVEFORMS IN A CDMA CELLULAR TELEPHONE SYSTEM", assigned to the assignee of the present invention and incorporated by reference herein. The method for providing digital wireless communications using CDMA was standardized by the Telecommunications Industry Association (TIA) in TIA/EIA/IS-95-A Mobile Station-Base Station Compatibility Standard for Dual-Mode Wideband Spread Spectrum Cellular System (hereafter IS-95).

Because each user's transmission contributes incrementally to the noise to other user's in a CDMA communication system, the capacity of a CDMA system is maximized by having each user transmit only as much data as necessary. A very effective means of reducing the user's burden on capacity without reducing the quality of service to that user is by means of variable rate data transmission, where data rate of transmissions by the user varies with time. A method for providing variable rate encoding of speech data is described in detail in U.S. Pat. No. 5,414,796, entitled "VARIABLE RATE VOCODER", which is assigned to the assignee of the present invention and is incorporated by reference herein.

In order protect against channel induced errors, digital error correction techniques are employed in wireless communication systems. One method for detecting and correcting for channel induced errors is through the employment of trellis decoding. A Viterbi decoder is a specific type of trellis decoder which has shown significant advantages over other error correction systems. A method and apparatus for performing Viterbi decoding of variable rate data are described in detail in copending U.S. patent application Ser. No. 08/126,477, filed Sep. 24, 1993, entitled "MULTIRATE SERIAL VITERBI DECODER FOR CDMA SYSTEM APPLICATIONS", which is assigned to the assignee of the present invention and incorporated by reference herein.

SUMMARY OF THE INVENTION

The present invention is a novel and improved method and apparatus for decoding a frame of digital data which contains redundant information provided to validate the decoding operation. The objective of the present invention is to improve coding gain which in a CDMA system would result in an increased capacity. In the present invention, a frame of data contains information bits and cyclic redundancy check (CRC) bits. The received frame is decoded and a check is conducted to determine whether the CRC bits correspond correctly for the decoded information bits. If the decoded frame passes the CRC test process, the decoded fame is provided to the user. However, if the decoded frame does not pass the CRC test, then at least one additional decoding process is performed on the received frame.

In the first exemplary embodiment of the present invention, if the CRC test is failed, a noise vector is summed with the received frame and the resultant frame is decoded for a second time. The CRC test is then performed on the decoded frame for a second time. As before, if the decoded frame passes the CRC test, then the information bits are output by the decoder. However, if the decoded frame again fails the CRC test then a second noise vector is added to the received frame and the frame is decoded for a third time. This process is repeated until the CRC test is successfully passed or until a predetermined number of decoding attempts are unsuccessfully made and the decoder declares that it is unable to decode the frame and a frame error is declared.

In the second exemplary embodiment of the present invention, when the CRC test fails, a set of the received symbols are replaced with symbol erasure indications. The frame is decoded for a second time. The CRC test is then performed on the decoded frame for a second time. Again, if the decoded frame passes the CRC test, the information bits are output by the decoder. However, if the decoded frame again fails the CRC test, then a second symbol or subset of symbols in the received frame of symbols are replaced by symbol erasure indications and the frame is decoded for a third time. This process is repeated until the CRC test is successfully passed or until a predetermined number of decoding attempts are unsuccessfully made and the decoder declares that it is unable to decode the frame and a frame error is declared. It should be noted that the exemplary embodiments may be implemented using a trellis decoder but are equally applicable to other decoders which are known in the art.

It will be understood by one of skill in the art that any other side information that indicates the proper decoding of the symbol data can be used and the invention is not limited to the use of cyclic redundancy codes.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
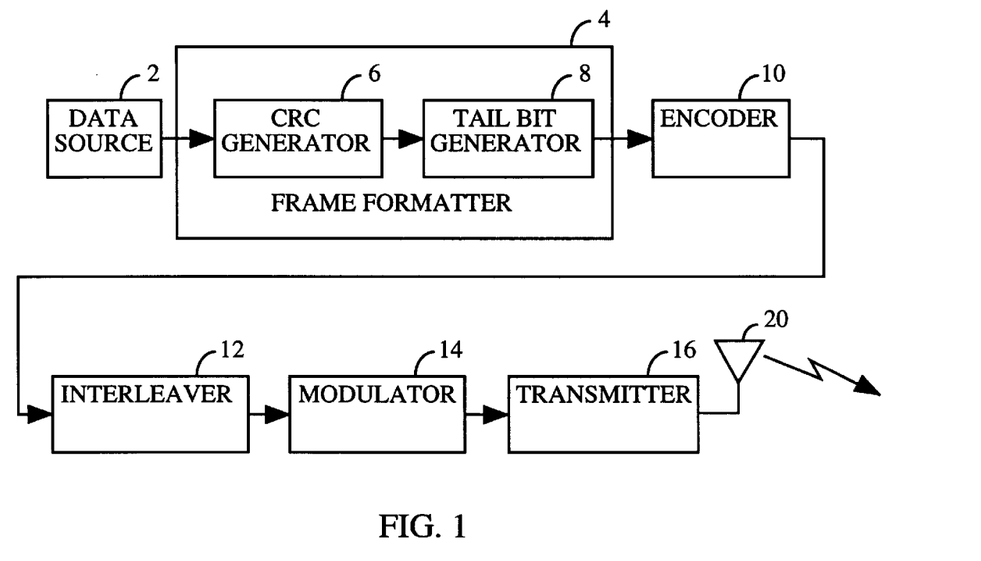
FIG. 1 is an exemplary transmission system which transmits data in frames which contain a set of CRC bits and a set of information bits.

Referring to FIG. 1, data source 2 provides frames of digital data. In the exemplary embodiment, data source 2 provides a frame every 20 ms, though the present invention is equally applicable to other rates. In the exemplary embodiment, data source 2 is a variable rate data source where the number of bits in the frames changes with time. In the exemplary embodiment, data source 2 is a variable rate speech coder, an example of which is described in the aforementioned U.S. Pat. No. 5,414,796.

The speech coder in the U.S. Pat. No. 5,414,796, selects a rate at which to encode a frame of digitized speech samples based on the energy of the samples in that frame. This reduces the number of bits sent, when the user is not speaking, which as described above minimizes the user's interference to other users in a CDMA communication system. It should be noted that the present invention is equally applicable to fixed rate data sources. Moreover, the present invention is equally applicable to the transmission of digital information other than speech, such as facsimile, video or other digitized data.

The frames of information bits from data source 2 are provided to frame formatter 4. In the exemplary embodiment, frame formatter 4 consists of CRC generator 6 and tail bit generator 8. CRC generator 6 generates a set of redundant check bits in accordance with the information bits provided in the frames from data source 2 and appends the redundant bits to the frame. The present invention is applicable to other redundant check bit generators, the design and implementation of redundant bit or parity bit generators are well known in the art. The exemplary embodiment of CRC generator 6 is described in the aforementioned U.S. Pat. No. 5,414,796 and has been standardized in IS-95. It should be noted that the present invention is equally applicable to other redundant bit generators as would be understood by one of skill in the art.

The frame comprising the information bits and CRC bits is provided to tail bit generator 8 which generates a set of tail bits and appends those bits to the frame. The purpose of the tail bits is to force encoder 10 to predetermined state when the frame is finished passing through it. In the exemplary embodiment, tail bit generator 8 generates a set of tail bits of value zero so as to force the output of encoder 10 to the zero state.

Referring now to FIGS. 2A–2D, the exemplary frame formats of the present invention are illustrated. It will be readily apparent to one skilled in the art that the present invention is equally applicable to the decoding of data transmitted using other frame formats.

Figure 2A:
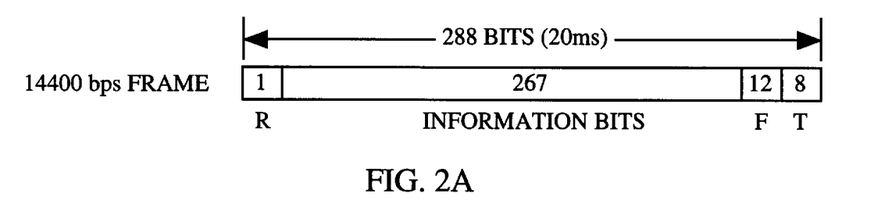
FIGS. 2A–2D are an exemplary illustration of the variable rate frame structure of the present invention.

In the exemplary embodiment, data source 2 provides data at four different rates. Referring to FIG. 2A, if data source 2 provides a frame consisting of 267 information bits, referred to as a full rate frame, then CRC generator 6 generates 12 CRC bits (denoted F) in accordance with the information bits and appends those bits to the frame. Tail bit generator 8 generates 8 tail (denoted T) of value zero and append those to the frame. A reserved bit (denoted R) is provided at the start of the frame which can be used for example for controlling transmission power.

Figure 2B:
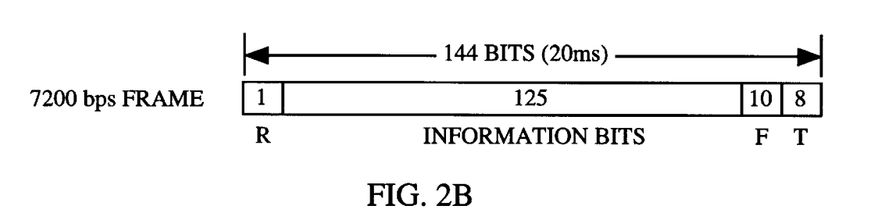

Referring to FIG. 2B, if data source 2 provides a frame consisting of 125 information bits, referred to as a half rate frame, then CRC generator 6 generates 10 CRC bits (denoted F) in accordance with the information bits and appends those bits to the frame. Then tail bit generator 8 generates 8 tail (denoted T) of value zero and append those to the frame. A reserved bit (denoted R) is provided at the start of the frame which can be used for example for controlling transmission power.

Figure 2C:
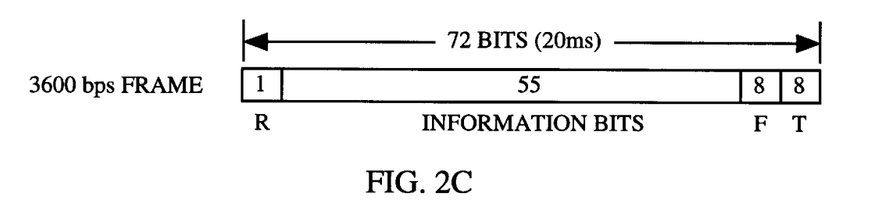

Referring to FIG. 2C, if data source 2 provides a frame consisting of 55 information bits, referred to as a quarter rate frame, then CRC generator 6 generates 8 CRC bits (denoted F) in accordance with the information bits and appends those bits to the frame. Then tail bit generator 8 generates 8 tail (denoted T) of value zero and append those to the frame. A reserved bit (denoted R) is provided at the start of the frame which can be used for example for controlling transmission power.

Figure 2D:
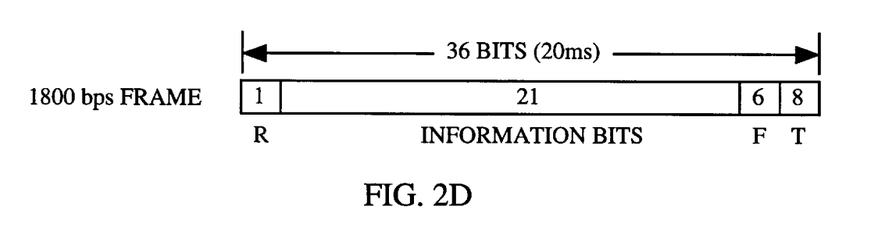

Referring to FIG. 2D, if data source 2 provides a frame consisting of 21 information bits, referred to as an eighth rate frame, then CRC generator 6 generates 6 CRC bits (denoted F) in accordance with the information bits and appends those bits to the frame. Then tail bit generator 8 generates 8 tail (denoted T) of value zero and append those to the frame. A reserved bit (denoted R) is provided at the start of the frame which can be used for example for controlling transmission power.

The frames output from frame formatter 4 are provided to encoder 10. In the exemplary embodiment, encoder 10 is a rate 1/2 convolutional encoder with constraint length nine (k=9). The design and implementation of convolutional encoders is well known in the art. The encoded symbols from encoder 10 are provided to interleaver 12.

In the exemplary embodiment, interleaver 12 selectively provides redundancy in the frame so that the symbol data occupies the full capacity of the frame. If the frame is less than full rate, then interleaver 12 provides duplicates of the symbols. Thus, if the frame is half rate, then interleaver 12 provides redundancy of rate 2 with each frame containing a single original copy of the symbols and a duplicate of those symbols, if the frame is quarter rate, the interleaver 12 provides redundancy of rate 4 with each frame containing a single original copy of the symbols and three duplicates of those symbols and if the frame is of rate one eight, then interleaver 12 provides redundancy of rate eight with each frame containing a single original copy of the symbols and seven duplicates of those symbols. After symbol repetition they are punctured by deleting 2 out of every 6 symbols to obtain a given number of symbols as described in the IS-95 standard. Interleaver 12, then, reorders the symbols in accordance with a predetermined reordering format. In the exemplary embodiment, interleaver 12 provides redundancy and reorders the frames as described in the IS-95 standard.

The revised symbols are provided to modulator 14 which modulates the symbols in accordance with a predetermined modulation format. In the exemplary embodiment, modulator 14 is a CDMA modulator as described in detail in the aforementioned U.S. Pat. Nos. 4,901,307, and 5,103,459.

The modulated frame of data is provided to transmitter 16 which upconverts and amplifies the frame and transmits the frame through antenna 20.

Figure 3:
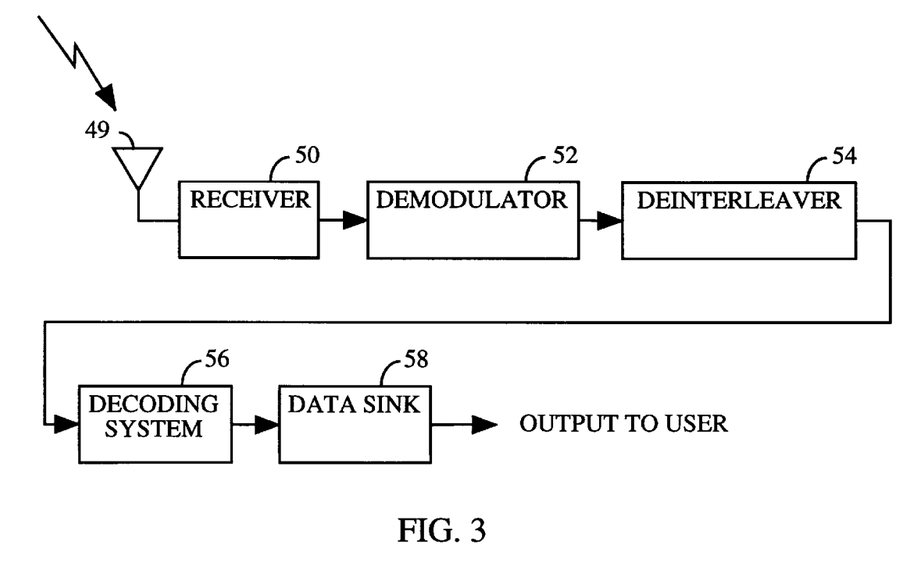
FIG. 3 is an exemplary implementation of the decoder of the present invention.

Referring to FIG. 3, a signal transmitted by the transmission system 1 of FIG. 1, is received by antenna 49 and provided to receiver (RCVR) 50. Receiver 50 downconverts, filters and amplifies the received signal and provides it to demodulator 52. Demodulator 52 demodulates the received signal in accordance with a predetermined demodulation format. In the exemplary embodiment, demodulator 52 is a CDMA demodulator as is described in detail in the aforementioned U.S. Pat. Nos. 4,901,307, and 5,103,459.

The demodulated frame of data is provided to de-interleaver 54 which reorders the soft symbol data in the frame in accordance with a predetermined reordering format and adds zeros in the places where the symbols were deleted in the transmission process to obtain a revised frame format. The revised frame of soft decision symbol data is provided to decoding system 56. Decoding system 56 decodes the data and provides the decoded data to data sink 58. Data sink 58 may provide post processing on the decoded frame of data. For example, if the data is compressed speech data, then the data sink 58 converts the speech parameters to digitized speech samples in accordance with a predetermined expansion format, such as that described in U.S. Pat. No. 5,414,796.

Figure 4:
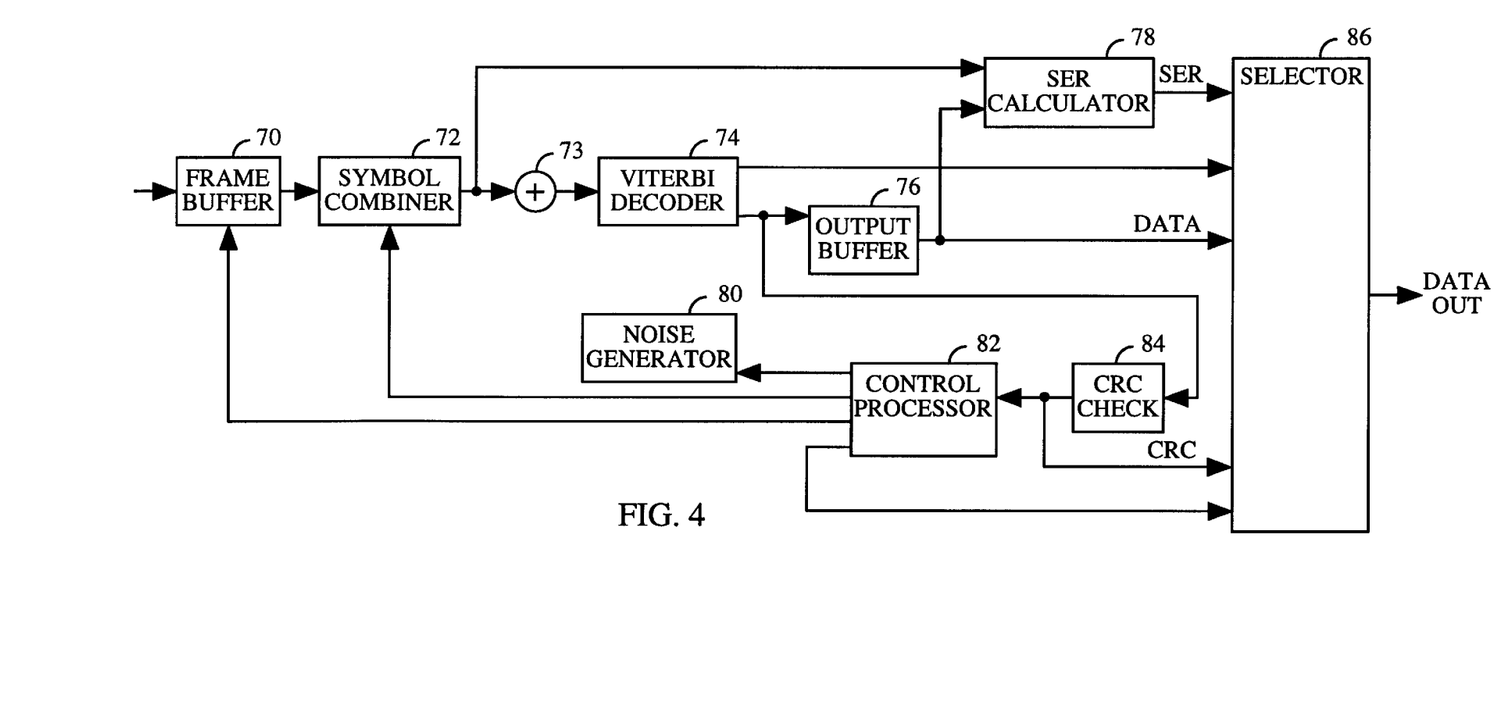
FIG. 4 is a block diagram of the first exemplary embodiment of the decoding system of the present invention.
Figure 5:
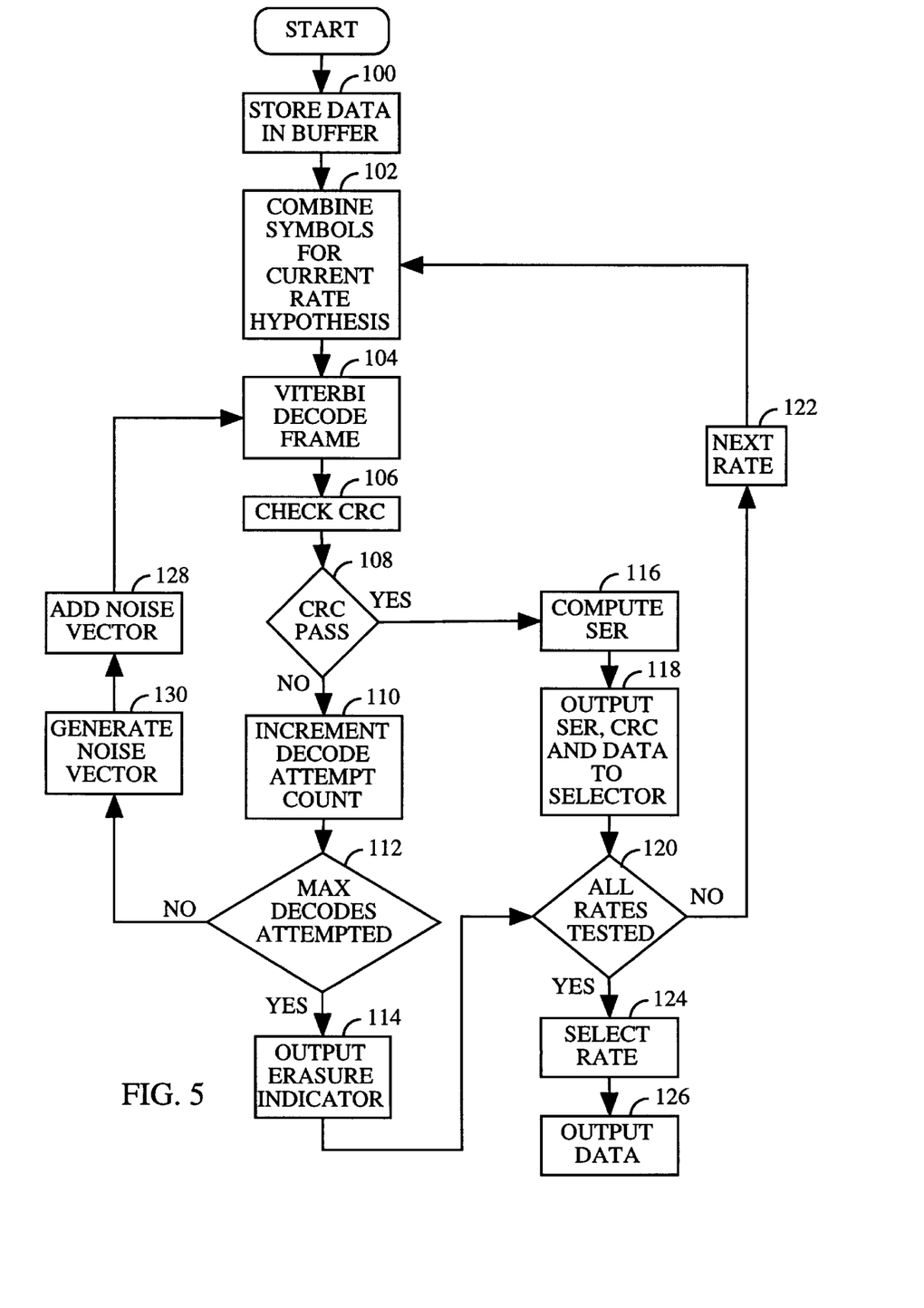
FIG. 5 is a flowchart describing the method of decoding data of the first exemplary embodiment.

FIG. 4 illustrates apparatus of the first exemplary embodiment of the decoding system of the present invention and FIG. 5 provides an accompanying flowchart illustrating the method of the first exemplary embodiment of the present invention. In block 100, the frame of revised soft symbol data from de-interleaver 54 is provided to and stored in frame buffer 70.

Then, in block 102, the symbols are combined in symbol combiner 72 for the current hypothesis. The combining process takes advantage of the fact that for rates less than full rate there is redundancy in the transmitted and so a better estimate of the transmitted symbol data can be arrived at by summing the energy of all redundant copies of that symbol. The process of generating an improved estimate of the symbol is described in detail in the aforementioned copending U.S. patent application Ser. No. 08/126,477. The exemplary embodiment, is the forward link transmission described in IS-95 where symbol combining is applicable. However, the present invention is equally applicable to the reverse link where symbol combining would not be performed since redundancy is not added to the transmitted frames.

The exemplary embodiment, first tests the hypothesis that the frame was transmitted at full rate. Under this hypothesis, no symbol repetition exists and so no combining of symbol data is performed. In block 104, the data from symbol combiner 72 is provided to Viterbi decoder 74. In a the exemplary embodiment, decoder 74 is a Viterbi decoder but one skilled in the art will appreciate that other decoders are equally applicable. The design and implementation of Viterbi decoders is known in the art and a specific implementation of the Viterbi decoder is described in the aforementioned copending U.S. patent application Ser. No. 08/126, 477.

Viterbi decoder 74 computes an estimate of the transmitted information bits and CRC bits in the frame and provides that frame estimate to CRC test subsystem 84. In block 106, CRC test subsystem 84 generates a set of redundant bits from the information bit estimates from the decoded information bits as was described with reference to CRC generator 6. CRC test subsystem 84 compares the CRC bits generated form the information bit estimates with the estimates of the redundant bits from Viterbi decoder 74. The result of that comparison is provided to control processor 82 which determines whether the CRC test is passed.

If, in block 108, the CRC test is passed then in block 116, the symbol error rate (SER) calculator 78 computes the symbol error rate for the decoded frame. SER calculator 78 generates a hard decision estimate of the received symbol data or receives the hard decision estimates from Viterbi decoder 74. Then, SER calculator 78 receives the decoded data of the frame from Viterbi decoder 74 and encodes the frame using the same encoding operation that was performed by encoder 10 to generate a set of reencoded symbol data. The reencoded symbol data is compared symbol by symbol to the hard decision symbol data and the number of discrepancies between the two sets of symbol data is the symbol error rate which is provided to selector 86 in block 118.

In the exemplary embodiment, output buffer 76 provides the decoded symbol data to selector 86 only after the CRC test has been passed for that decoding of that rate hypothesis. In a preferred embodiment, Viterbi decoder 74 provides metric data to selector 86 to assist in the rate selection. The metric data provided to selector could be a single bit Yamamoto metric and/or a total metric.

If the CRC test fails in block 108, then in block 110 control processor 82 increments a count of the number of attempts made at decoding the frame at the current rate hypothesis. In block 112, control processor 82 tests whether the number of attempts at decoding the frame has reached a predetermined maximum number of attempts in the decoding of the current rate hypothesis. If the maximum number of attempts has been reached then the flow moves to block 114 and control processor 82 provides a signal to selector 86 indicating that if the rate was transmitted at the rate of the current rate hypothesis, then a frame error must be declared.

If back in control block 112, the maximum number of attempts to decode the frame at the current rate had not been reached, then control processor 82 provides a message to noise generator 80. In block 130 in response to the message from control processor 82, noise generator 80 generates a pseudorandom noise vector. Noise generator 80 can deterministically compute the noise generator or can retrieve the noise vector from a set of predetermined noise vectors. In block 128 the noise vector is provided to summing element 73 which adds the pseudorandom noise vector to the soft symbol frame data from buffer 70. The frame from summer 73 is provided to Viterbi decoder 74. The flow moves to block 104 and the process repeats as described previously.

In block 120, control processor 82 determines whether all possible rates have been tested. If not, then the flow moves to block 122 which selects the next rate to be tested, then the flow moves to block 102 and the next rate hypothesis is tested. In response to a signal from control processor 82, frame buffer 70 provides the frame data to symbol combiner 72. Control processor 82 provides a signal indicative of the rate hypothesis to be tested to symbol combiner 72. In block 102, symbol combiner 72 combines the symbol data in accordance with the rate hypothesis to be tested. The flow moves to block 104 and proceeds as described above.

If in block 120, all rates have been tested, then in block 124 selector 86 determines the most likely rate at which the data was transmitted and provides the data corresponding to that rate in block 126. Selector 86 may decide to erase the frame due to bad quality measures. In the exemplary embodiment, selector 86 determines the rate based on the symbol error rate of the different decoded frames and the metric data information provided by the Viterbi decoder.

In the exemplary embodiment, each rate hypothesis is tested by decoding the entire frame, modifying the frame, if necessary, and retesting at that rate. However in a preferred embodiment, the frame is decoded at each of the rates and the CRC is tested prior to additional decoding attempts. In addition, in a preferred embodiment, a determination of which rate hypotheses are most likely is performed and those that are least likely are eliminated from subsequent decoding attempts. One method for eliminating rate hypotheses would be based on the SER or quality metrics of the rate hypothesis.

Figure 6:
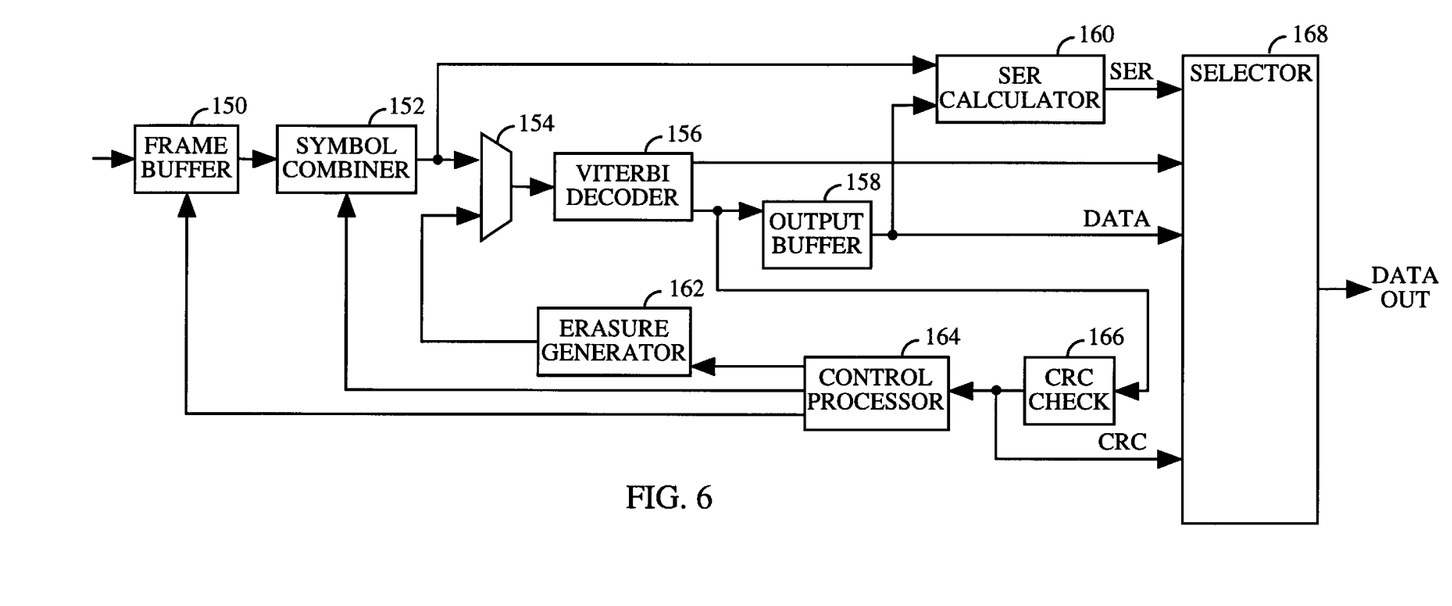
FIG. 6 is a block diagram of the second exemplary embodiment of the decoding system of the present invention.
Figure 7:
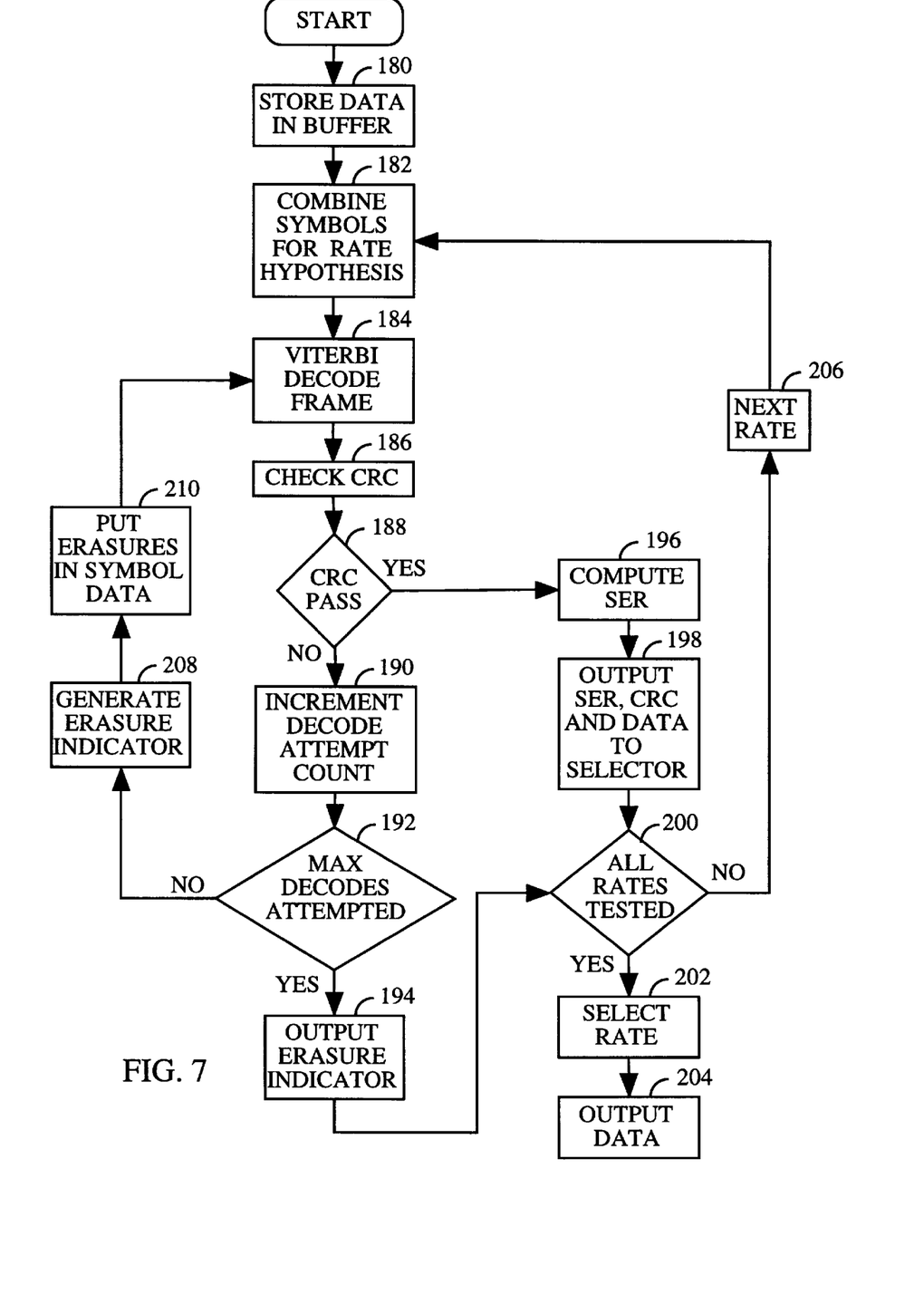
FIG. 7 is a flowchart describing the method of decoding data of the second exemplary embodiment.

FIG. 6 illustrates apparatus of the second exemplary embodiment of the decoding system of the present invention and FIG. 7 provides an accompanying flowchart illustrating the method of the second exemplary embodiment of the present invention. In block 180, the frame of revised soft symbol data from de-interleaver 54 is provided to and stored in frame buffer 150.

Then, in block 182, the symbols are combined in symbol combiner 152 in accordance with the current rate hypothesis. The combining process takes advantage of the fact that for rates less than full rate there is redundancy in the transmitted symbol data and so a better estimate of the transmitted symbol data can be arrived at by summing the energy of all redundant copies of that symbol. The process of generating an improved estimate of the symbol is described in detail in the aforementioned copending U.S. patent application Ser. No. 08/126,477.

The exemplary embodiment first tests the hypothesis that the frame was transmitted at full rate. Under this hypothesis, no symbol repetition exists and so no combining of symbol data is performed for the full rate hypothesis. In block 184, the data from symbol combiner 152 is provided to Viterbi decoder 156. In a the exemplary embodiment, decoder 156 is a Viterbi decoder but one skilled in the art will appreciate that other decoders are equally applicable. The design and implementation of Viterbi decoders is known in the art and a specific implementation of the Viterbi decoder is described in the aforementioned copending U.S. patent application Ser. No. 08/126,477.

Viterbi decoder 156 computes an estimate of the transmitted information bits and CRC bits in the frame and provides that frame estimate to CRC test subsystem 166. In block 186, CRC test subsystem 166 generates a set of redundant bits from the decoded information bits as was described with reference to CRC generator 6. CRC test subsystem 166 compares the CRC bits generated from the information bit estimates with the estimates of the redundant bits from Viterbi decoder 156. The result of that comparison is provided to control processor 164 which determines whether the CRC test is passed.

If, in control block 188, the CRC test is passed, then in block 196 the symbol error rate (SER) calculator 160 computes the symbol error rate for the decoded frame. SER calculator 160 generates a hard decision estimate of the received symbol data or receives the hard decision estimates from Viterbi decoder 156. Then, SER calculator 160 receives the decoded data of the frame from Viterbi decoder 156 and encodes the frame using the same encoding operation that was performed by encoder 10 to generate a set of reencoded symbol data. The reencoded symbol data is compared symbol by symbol to the hard decision symbol data and the number of discrepancies between the two sets of symbol data is the symbol error rate which is provided to selector 168 in block 198.

In the exemplary embodiment, output buffer 158 provides the decoded symbol data to selector 168 only after the CRC test has been passed for that decoding of that rate hypothesis. In a preferred embodiment, Viterbi decoder 156 provides metric data to selector 168 to assist in the rate selection. The metric data provided to selector could be a single bit Yamamoto metric or a total metric.

If the CRC test fails in block 188, then in block 190 control processor 164 increments a count of the number of attempts made at decoding the frame. In block 192, control processor 164 determines whether the number of attempts at decoding the frame has reached a predetermined maximum number of attempts for decoding the frame at the current rate hypothesis. If the maximum number of attempts has been reached, then the flow moves to block 194 and control processor 164 provides a signal to selector 168 indicating that if the rate was transmitted at the rate of the current rate hypothesis, then a frame error must be declared.

If in control block 192, the maximum number of attempts to decode the frame at the current rate had not been reached, then control processor 164 provides a message to erasure generator 162. In block 208 in response to the message from control processor 164, erasure generator 162 generates an erasure indicator vector. Erasure generator 162 can deterministically compute the locations for the symbol erasure replacements or can retrieve the erasure indicator vector from a stored set of predetermined erasure indicator vectors. In block 210 the erasure indicator vector is provided to mulitplexer 154 which substitutes the erasure indications into the soft symbol frame data from buffer 150. The frame from multiplexer 154 is provided to Viterbi decoder 156. The flow moves to block 184 and the process repeats as described previously.

In block 200, control processor 164 determines whether all possible rates have been tested. If not, then the flow moves to block 206 which selects the next rate to be tested, then the flow moves to block 182 and the next rate hypothesis is tested. In response to a signal from control processor 164, frame buffer 150 provides the frame data to symbol combiner 152. Control processor 164 provides a signal indicative of the rate hypothesis to be tested to symbol combiner 152. In block 182, symbol combiner 152 combines the symbol data in accordance with the rate hypothesis to be tested. The flow moves to block 184 and proceeds as described above.

If in block 200, all rates have been tested, then in block 202 selector 168 determines the most likely rate at which the data was transmitted and provides the data corresponding to that rate in block 204. The selector 168 may decide to erase the frame due to bad quality measures. In the exemplary embodiment, selector 168 determines the rate based on the symbol error rate of the different decoded frames The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A decoding system comprising:

a decoder for receiving a frame of data and for decoding said frame of data to provide a set of information bits and at least one check bit;

a check means for receiving said information bits and said at least one check bit and for determining a validity of said decoding in accordance with said information bits and said at least one check bit; and modification means for modifying said frame of data when said determined validity of said decoding indicates a failure to properly decode said frame, wherein said modification means comprises:

erasure generator means for generating an erasure signal; and combining means for combining said frame of data with said erasure signal to provide a modified frame of data.

2. The decoding system of claim 1 wherein said decoder is further for decoding said modified frame of data.

3. The decoding system of claim 1 wherein said erasure generator means generates said erasure signal by retrieving an erasure signal from a predetermined set of erasure signals.

4. The decoding system of claim 1 wherein said erasure generator means generates said erasure signal in accordance with a deterministic erasure generation algorithm.

5. The decoding system of claim 1 wherein said at least one check bit is a cyclic redundancy check bit.

6. The decoding system of claim 1 wherein said check means determines said validity of said decoding by generating at least one additional check bit in accordance with said information bits and by comparing said at least one additional check bit with said at least one check bit.

7. The method of claim 1 wherein said step of determining a validity of said decoding is performed by generating at least one additional check bit in accordance with said information bits and by comparing said at least one additional check bit with said at least one check bit.

8. A decoding system comprising:

a decoder for receiving a frame of data and for decoding said frame of data to provide a set of information bits and at least one check bit;

a check means for receiving said information bits and said at least one check bit and for determining a validity of said decoding in accordance with said information bits and said at least one check bit; and modification means for modifying said frame of data when said determined validity of said decoding indicates a failure to properly decode said frame, wherein said modification means comprises:

noise generator means for generating a noise signal; and combining means for combining said frame of data with said noise signal to provide a modified frame of data.

9. The decoding system of claim 8 wherein said decoder is further for decoding said modified frame of data.

10. The decoding system of claim 8 wherein said noise generator means generates said noise signal by retrieving a noise signal from a predetermined set of noise signals.

11. The decoding system of claim 8 wherein said noise generator means generates said noise signal in accordance with a deterministic noise generation algorithm.

12. A decoding system comprising:

a decoder for receiving a frame of data and for decoding said frame of data to provide a set of information bits and at least one check bit, wherein said decoder is a trellis decoder;

a check means for receiving said information bits and said at least one check bit and for determining a validity of said decoding in accordance with said information bits and said at least one check bit; and modification means for modifying said frame of data when said determined validity of said decoding indicates a failure to properly decode said frame.

13. A decoding system comprising:

a decoder for receiving a frame of data and for decoding said frame of data to provide a set of information bits and at least one check bit, wherein said decoder is a Viterbi decoder;

a check means for receiving said information bits and said at least one check bit and for determining a validity of said decoding in accordance with said information bits and said at least one check bit; and modification means for modifying said frame of data when said determined validity of said decoding indicates a failure to properly decode said frame.

14. A method for decoding comprising the steps of:

receiving a frame of data;

decoding said frame of data to provide a set of information bits and at least one check bit;

receiving said information bits and said at least one check bit;

determining a validity of said decoding in accordance with said information bits and said at least one check bit;

modifying said frame of data when said determined validity of said decoding indicates a failure to properly decode said frame, wherein said step of modifying comprises:

generating an erasure signal; and combining said frame of data with said erasure signal to provide a modified frame of data.

15. The method of claim 14 further comprising the step of decoding said modified frame of data.

16. The method of claim 14 wherein said step of generating an erasure signal is performed by retrieving an erasure signal from a predetermined set of erasure signals.

17. The method of claim 14 wherein said step of generating an erasure signal is performed in accordance with a deterministic erasure generation algorithm.

18. The method of claim 14 wherein said at least one check bit is a cyclic redundancy check bit.

19. A method for decoding comprising the steps of:

receiving a frame of data;

decoding said frame of data to provide a set of information bits and at least one check bit;

receiving said information bits and said at least one check bit;

determining a validity of said decoding in accordance with said information bits and said at least one check bit;

modifying said frame of data when said determined validity of said decoding indicates a failure to properly decode said frame, wherein said step of modifying comprises:

generating a noise signal; and combining said frame of data with said noise signal to provide a modified frame of data.

20. The method of claim 19 further comprising the step of decoding said modified frame of data.

21. The method of claim 19 wherein said step of generating a noise signal is performed by retrieving a noise signal from a predetermined set of noise signals.

22. The method of claim 19 wherein said step of generating a noise signal is performed in accordance with a deterministic noise generation algorithm.

23. A method for decoding comprising the steps of:

receiving a frame of data;

decoding said frame of data to provide a set of information bits and at least one check bit, wherein said decoding is performed using a trellis decoder;

receiving said information bits and said at least one check bit;

determining a validity of said decoding in accordance with said information bits and said at least one check bit;

modifying said frame of data when said determined validity of said decoding indicates a failure to properly decode said frame.

24. A method for decoding comprising the steps of:

receiving a frame of data;

decoding said frame of data to provide a set of information bits and at least one check bit, wherein said decoding is performed using a Viterbi decoder;

receiving said information bits and said at least one check bit;

determining a validity of said decoding in accordance with said information bits and said at least one check bit;

modifying said frame of data when said determined validity of said decoding indicates a failure to properly decode said frame.

* * * * *